(12) United States Patent
Kobane et al.

(10) Patent No.: US 7,514,848 B2
(45) Date of Patent: Apr. 7, 2009

(54) PIEZOELECTRIC STACK AND PRODUCTION METHOD OF PIEZOELECTRIC STACK

(75) Inventors: Yoichi Kobane, Kuwana (JP); Akira Fujii, Yokkaichi (JP); Hideo Kamiya, Nagoya (JP); Hiroaki Makino, Aichi (JP)

(73) Assignees: Denso Corporation, Kariya, Aichi-Pref. (JP); Toyota Jidosha Kabushiki Kaisha, Toyota-Shi, Aichi-Ken (JP)

( * ) Notice: Subject to any disclaimer, the term of this patent is extended or adjusted under 35 U.S.C. 154(b) by 289 days.

(21) Appl. No.: 11/059,635

(22) Filed: Feb. 17, 2005

(65) Prior Publication Data

US 2005/0206274 A1    Sep. 22, 2005

(30) Foreign Application Priority Data

Feb. 17, 2004    (JP)    ............... 2004-040441

(51) Int. Cl.
*H01L 41/08*    (2006.01)
(52) U.S. Cl. .................. 310/328; 310/365; 310/366
(58) Field of Classification Search ............. 310/328, 310/266, 265, 366, 365, 800; 428/699; 29/25.35; 427/100

See application file for complete search history.

(56) References Cited

U.S. PATENT DOCUMENTS 6,230,378 B1 *    5/2001    Cramer et al. .............. 310/800
6,291,932 B1 *    9/2001    Maruyama et al. .......... 310/366
6,511,763 B1 *    1/2003    Kida et al. .................. 428/699

FOREIGN PATENT DOCUMENTS

| DE | 196 15 695 C1 | | 7/1997 |
|----|---------------|---|--------|
| JP | 2001-181041 | | 7/2001 |
| JP | 2002-193691 | | 7/2002 |
| JP | 2003-183080 | | 7/2003 |
| JP | 2005-235863 | * | 2/2005 |

OTHER PUBLICATIONS

German Search Report dated May 19, 2006 and English translation.

* cited by examiner

*Primary Examiner*—Thomas M Dougherty
*Assistant Examiner*—Karen B Addison
(74) *Attorney, Agent, or Firm*—Nixon & Vanderhye PC (57) ABSTRACT

An object of the present invention is to provide a piezoelectric stack substantially free from deterioration in performance and having high reliability, and a production method thereof. A piezoelectric layer 111, 112 comprising PZT and an internal electrode layer 121, 122 are alternately stacked; the grain boundary-filling factor of a Pb-based glass in the crystal grain boundary of the piezoelectric layer 111, 112 is 95% or more; in producing a piezoelectric stack 1 in which a piezoelectric layer 111, 112 comprising PZT and an internal electrode layer 121, 122 are alternately stacked, unfired sheets for the piezoelectric layer 111, 112 are stacked to produce an unfired stacked body, the unfired sheet containing Pb in excess of the stoichiometric ratio in PZT and having printed thereon an electrically conducting paste for the internal electrode layer 121, 122, and the unfired stacked body is fired in an oxygen atmosphere having an oxygen concentration of 40 to 100 vol % such that the grain boundary-filling factor of a Pb-based glass in the crystal grain boundary inside the piezoelectric layer 111, 112 is 95% or more.

4 Claims, 9 Drawing Sheets

PIEZOELECTRIC STACK AND PRODUCTION METHOD OF PIEZOELECTRIC STACK

FIELD OF THE INVENTION

The present invention relates to a piezoelectric stack usable for a piezoelectric actuator used in a fuel injection device or the like of an automobile, and a production method thereof.

BACKGROUND OF THE INVENTION

A piezoelectric actuator employing a piezoelectric stack is sometimes used as a driving source of a fuel injection device for an internal combustion engine of a vehicle such as an automobile.

The piezoelectric stack within the piezoelectric actuator is hermetically sealed in an airtight package to protect it from high-temperature fuel or moisture.

Figure 6:
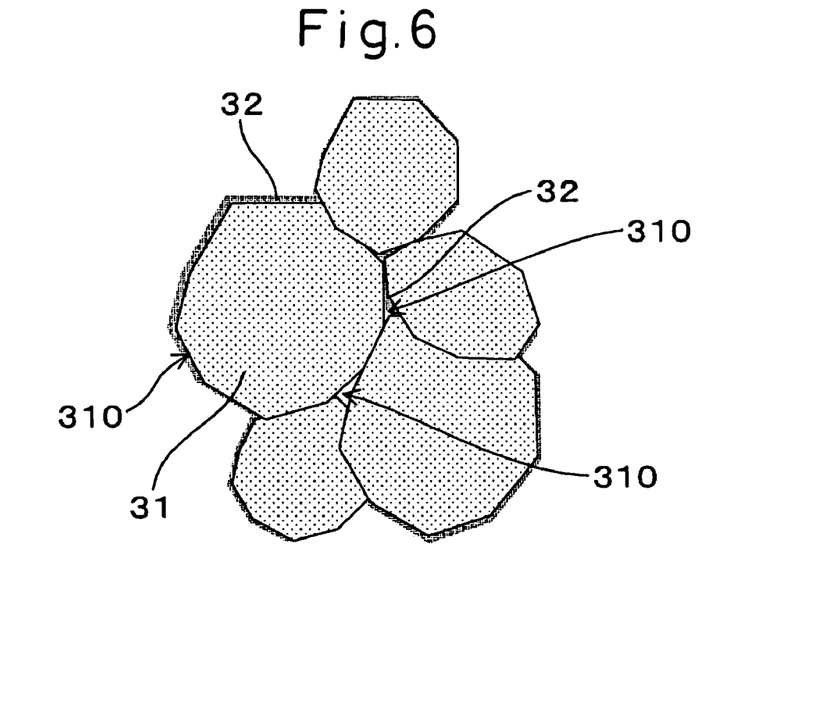
FIG. 6 is an explanatory view showing the crystal grains and crystal grain boundaries in the piezoelectric layer according to Example 4.

However, the piezoelectric layer of the piezoelectric stack comprises a polycrystalline ceramic and, accordingly, a large number of crystal grain boundaries are present inside the piezoelectric layer. The crystal grain boundary includes gaps as shown in FIG. 6 which is described later.

When the piezoelectric stack is exposed to a high-temperature and closed environment, originally adsorbed moisture, a decomposition product of the constituent resin material, and various substances constituting the internal electrode layer and piezoelectric layer sometimes intrude into the crystal grain boundary and by this phenomenon, the physical properties such as insulation resistance value of the piezoelectric layer are changed.

This phenomenon gives rise to deterioration in the performance or reduction in the reliability of the piezoelectric stack.

Particularly, when the intruded substance is an electrically conducting substance, this may incur a decrease in the insulation resistance value of the piezoelectric layer.

In JP-2001181041-A as a prior art, a glass phase is present only at the triple point of grains and is not present at most of other crystal grain boundaries. Therefore, an electrically conducting substance may intrude into a crystal grain boundary having no glass phase to decrease the insulation resistance value.

An object of the present invention is to provide a piezoelectric stack substantially free from deterioration in the performance and having high reliability, and a production method thereof.

SUMMARY OF THE INVENTION

A first invention is a piezoelectric stack obtained by alternately stacking a piezoelectric layer comprising PZT (lead titanate zirconate) and an internal electrode layer, wherein the grain boundary-filling factor of a Pb-based glass in the crystal grain boundary of the piezoelectric layer is 95% or more.

In the piezoelectric stack according to the first invention, the crystal grain boundary is filled with a Pb-based glass and scarcely allows intrusion of moisture or other substances.

Therefore, the piezoelectric layer can be prevented from change in physical properties such as an insulation resistance value and the piezoelectric stack can be protected from a deterioration in performance or a reduction in reliability.

A second invention is a method for producing a piezoelectric stack in which a piezoelectric layer comprising PZT and an internal electrode layer are alternately stacked, the method comprising:

stacking unfired sheets for the piezoelectric layer to produce an unfired stacked body, the unfired sheet containing Pb in excess of the stoichiometric ratio in PZT (lead zirconate titanate) and having printed thereon an electrically conducting paste for the internal electrode layer, and firing the unfired stacked body in an oxygen atmosphere having an oxygen concentration of 40 to 100 vol % such that the grain boundary-filling factor of a Pb-based glass in the crystal grain boundary inside the piezoelectric layer is 95% or more.

By performing the firing at an oxygen concentration in the above-described range, the Pb-based glass more readily fills the crystal grain boundary. The crystal grain boundary filled with a Pb-based glass can be made to not allow intrusion of moisture or other substances.

Therefore, the piezoelectric layer can be protected from a change in physical properties such as insulation resistance value and the piezoelectric stack can be protected from deterioration in performance or reduction in reliability.

According to the present invention, a piezoelectric stack substantially free from deterioration in the performance and having high reliability and a production method thereof can be provided.

DETAILED DESCRIPTION

In the piezoelectric stack according to the first and second inventions, a piezoelectric layer and an internal electrode layer are alternately stacked and, by applying an energization current to the internal electrode layer, a potential difference is generated among respective piezoelectric layers and thereby the piezoelectric layer is extended. The energization of the internal electrode layer is performed by supplying an energization current to side electrodes provided on side faces of the piezoelectric stack.

As for the piezoelectric stack, an entire electrode structure of forming an internal electrode layer on the entire surface of the piezoelectric layer and a partial electrode structure of partially providing an internal electrode layer on the piezoelectric layer (see, FIGS. 1 and 2 which are described later) are known. In the first and second inventions, either piezoelectric stack can be produced.

In some cases, a separate layer not extended by energization, as dummy layer, is provided on end faces in the stacked direction of the piezoelectric stack.

In the piezoelectric stack obtained by the first or second invention, the piezoelectric layer comprises a fired PZT polycrystal, a crystal grain boundary is present between a crystal grain and a crystal grain, and the grain boundary-filling factor of a Pb-based glass in the crystal grain boundary is 95% or more.

Figure 7:
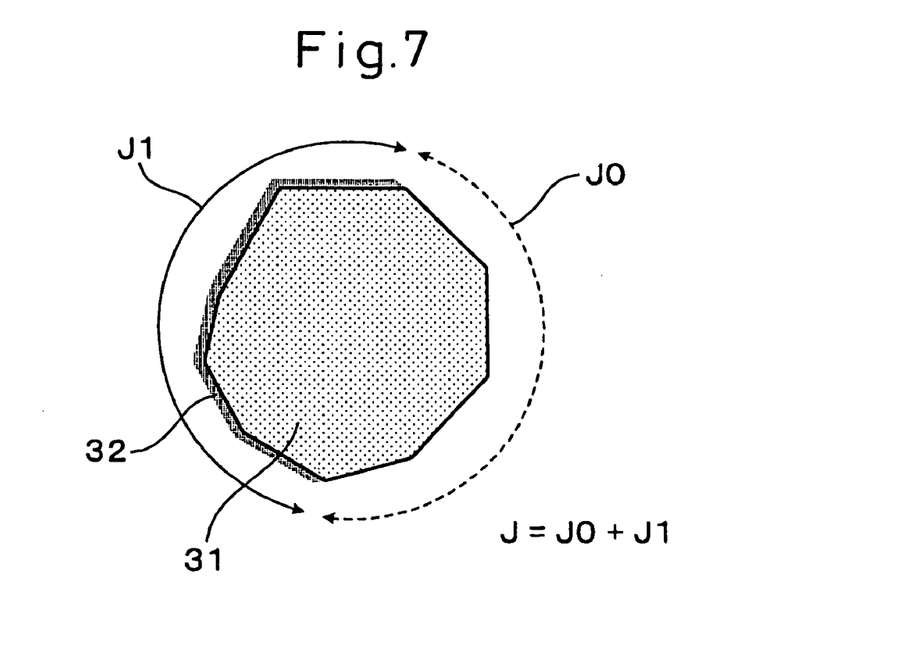
FIG. 7 is an explanatory view showing the grain boundary length J1 in the region filled with crystal grains and the grain boundary length J0 in the unfilled region according to Example 4.

The grain boundary-filling factor as used herein is a value (%) obtained by dividing, as described in Example 4 later or as shown in FIGS. 6 and 7, the grain boundary length in the region filled with a Pb-based glass by the entire grain boundary length of the relevant crystal grain.

The entire grain boundary length as used herein is, in the relevant crystal grain, "length of filled grain boundary (that is, the length of the portion where a Pb-based glass is adhering to the interface of crystal grains)+length of unfilled grain boundary".

If the grain boundary-filling factor is less than 95%, moisture or other substances may intrude to cause a change in the properties of the piezoelectric layer.

In the first invention, the grain boundary-filling factor is most preferably 100%.

The Pb-based glass is constituted by substances contained in the piezoelectric layer or internal electrode layer and comprises a glass material mainly containing, for example, $Pb-WO_3$ or $Pb-MoO_3$. This glass material is nearly amorphous and also contains substances other than Pb, W and Mo.

The method of firing the unfired stacked body to deposit a Pb-based glass on the crystal grain boundary inside the piezoelectric layer, thereby obtaining a fired stack, is described below.

The piezoelectric layer comprises PZT and therefore, a compound containing Pb must be used for the raw material of the piezoelectric layer. In this case, by using a raw material containing Pb slightly in excess of the stoichiometric ratio in PZT, glass components where Pb is bonded to other substances can be precipitated into the crystal grain boundary.

Also, when Pb is contained in the firing atmosphere at the time of firing the unfired stacked body to obtain a fired stack, volatilization of Pb from the unfired stacked body can be prevented. Furthermore, when a Pb-excess atmosphere is positively formed, glass components where Pb is bonded to other substances can intrude into the gap, that is, crystal grain boundary, and along the dropping of temperature after the completion of firing, can deposit on the crystal grain boundary.

In the first invention, when the piezoelectric stack has a partial electrode structure, the length of the void formed at the end part of the internal electrode layer is preferably less than 30 μm.

By limiting the void to this length, the piezoelectric stack can be prevented from decrease in the insulation resistance value. The void length is most preferably 0 μm, that is, a state having no void is most preferred.

The definition of the void is described later (see, Example 7 and FIG. 10).

The piezoelectric stack according to the first invention can be used for the piezoelectric actuator employed as a driving source in a fuel injection device of an internal combustion engine.

In use for a piezoelectric actuation of a fuel injection device, the piezoelectric stack must be sealed in a hermetically closed container and, at the same time, the environment where the fuel injection device is used is in the vicinity of an internal combustion engine and is in a high-temperature atmosphere.

That is, the piezoelectric stack is used in an environment readily allowing for intrusion of moisture or various substances constituting the internal electrode layer and piezoelectric layer into the crystal grain boundary inside the piezoelectric layer.

Therefore, by using a piezoelectric stack where the crystal grain boundary is filled with a Pb-based glass as in the first invention, deterioration of the piezoelectric stack can be prevented and in turn, the reliability of the fuel injection device can be improved.

EXAMPLES

Example 1

The piezoelectric stack according to the present invention is described below.

In the piezoelectric stack of this Example, a piezoelectric layer comprising PZT (lead zirconate titanate) and an internal electrode layer are alternately stacked and the grain boundary-filling factor of a Pb-based glass in the crystal grain boundary inside the piezoelectric layer is 95% or more.

This is described in detail below.

Figure 1:
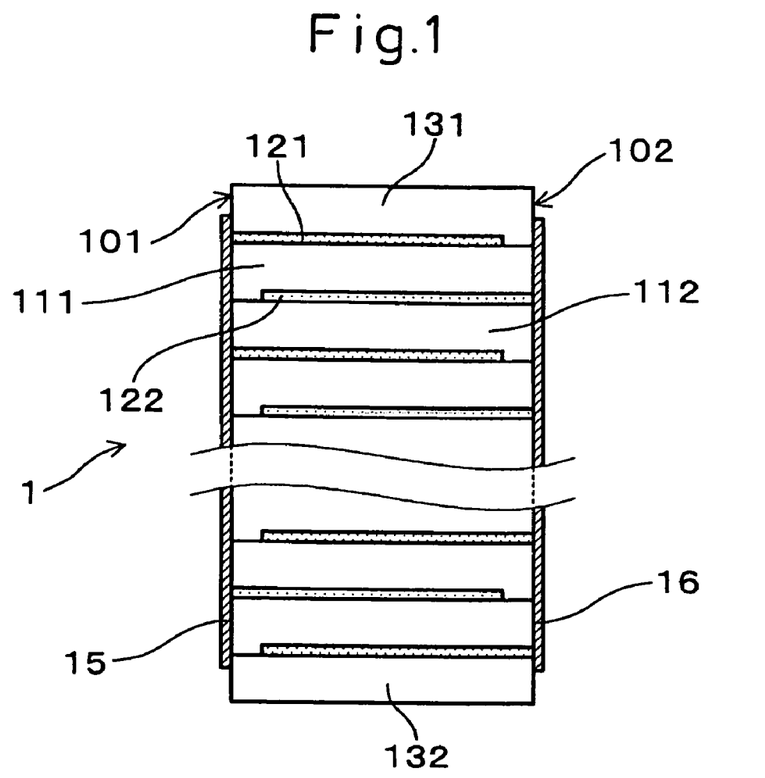
FIG. 1 is a cross-sectional explanatory view of the piezoelectric stack according to Example 1.
Figure 2:
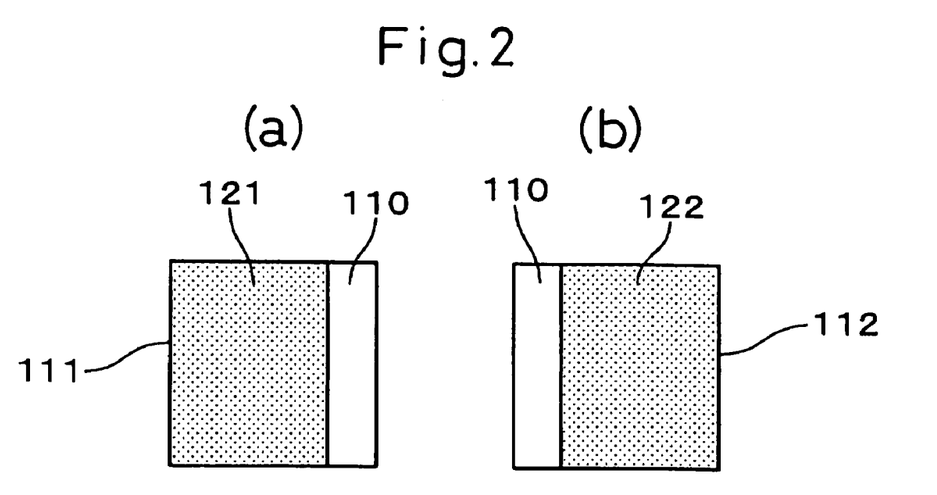
FIG. 2 is a plan view of the piezoelectric layer and the internal electrode layer according to Example 1.

In the piezoelectric stack of this Example, as shown in FIGS. 1 and 2, a piezoelectric layer 111 where an internal electrode layer 121 is provided in the portion except for the reserved electrode part 110, and a piezoelectric layer 112 where an internal electrode layer 122 is provided in the portion except for the reserved electrode part 110, are alternately stacked.

The end part of the internal electrode layer 121 is exposed to the side face 101 and the end part of the internal electrode layer 122 is exposed to the side face 102. These exposed end parts can be energized by side electrodes 15 and 16, respectively. The piezoelectric layers 111 and 112 each comprise PZT, the internal electrode layers 121 and 122 each comprises Ag—Pd, and the side electrodes each comprises Ag. Incidentally, the piezoelectric layers 131 and 132 disposed on both end faces in the stacked direction are dummy layers which do not extend by energization.

The PZT of the piezoelectric layers 111 and 112 in the piezoelectric stack 1 is a polycrystal and has gaps extending in the crystal grain boundaries between adjacent crystal grains. This gap portion is filled with a Pb-based glass and the grain boundary-filling factor is 95% or more. The details of the grain boundary-filling factor are described in Example 4.

In the piezoelectric stack 1 of this Example, the crystal grain boundary is filled with a Pb-based glass and scarcely allows for intrusion of moisture or other substances. Therefore, the piezoelectric layers 111 and 112 can be protected from a change in the physical properties such as insulation resistance value and the piezoelectric stack 1 can be protected from deterioration in performance or a reduction in reliability.

In this way, according to this Example, a piezoelectric stack substantially free from deterioration in performance and having a high reliability can be obtained.

Example 2

In this Example, the method for producing the piezoelectric stack of Example 1 is described.

That is, for producing a piezoelectric stack as described in Example 1, in which a piezoelectric layer comprising PZT (lead zirconate titanate) and an internal electrode layer are alternately stacked, unfired sheets for the piezoelectric layer, where Pb is contained in excess of the stoichiometric ratio in PZT (lead zirconate titanate) and an electrically conducting paste for the internal electrode layer is printed, are stacked to produce an unfired stacked body, and the unfired stacked body is fired in an oxygen atmosphere having an oxygen concentration of 40 to 100 vol % such that the grain boundary-filling factor of a Pb-based glass in the crystal grain boundary inside the piezoelectric layer is 95% or more.

This is described in detail below.

First, the production of slurry for the piezoelectric layer is described.

After weighing a raw material powder of the piezoelectric layer, the raw material powder and a dispersant were mixed in a mixer and the mixture was then dried and milled by a mortar machine.

At this time, the unfired sheet was produced by using a raw material powder for the piezoelectric layer, where Pb was contained in excess of the stoichiometric ratio in PZT.

More specifically, although, in the piezoelectric stack which is an ABO3-type dielectric ceramic, the components are usually blended to give a molar ratio of A:B:O=1:1:3, excess lead was contained in the A site such that when the B site was assumed to be 1, the total of components in the A site containing lead accounted for a molar ratio of 1.00 or more, thereby providing a Pb-excess state.

The milled raw material powder was calcined to obtain a calcined powder, a dispersant was mixed with the calcined powder, and the mixture was wet-ground, dried and again milled in a mortar machine. Subsequently, a dispersant, a solvent, a plasticizer and a binder were added thereto and mixed to form slurry. The slurry was subjected to a defoaming treatment and adjustment of the viscosity and was then filtered through a filter to obtain slurry for the piezoelectric layer.

Thereafter, a paste for the internal electrode layer was produced.

From the slurry for the piezoelectric layer, a green sheet was produced by using a doctor blade process. This green sheet was cut into an appropriate size, dried and punched by a die to obtain an unfired sheet for the piezoelectric layer.

The paste for the internal electrode layer was printed on the unfired sheet and dried, and then a predetermined number of unfired sheets were press-bonded and stacked to obtain an unfired stacked body.

The firing of the unfired stacked body is described below.

The unfired stacked body was fired to deposit a Pb-based glass on the crystal grain boundary inside the piezoelectric layer, thereby obtaining a fired stack.

Figure 3:
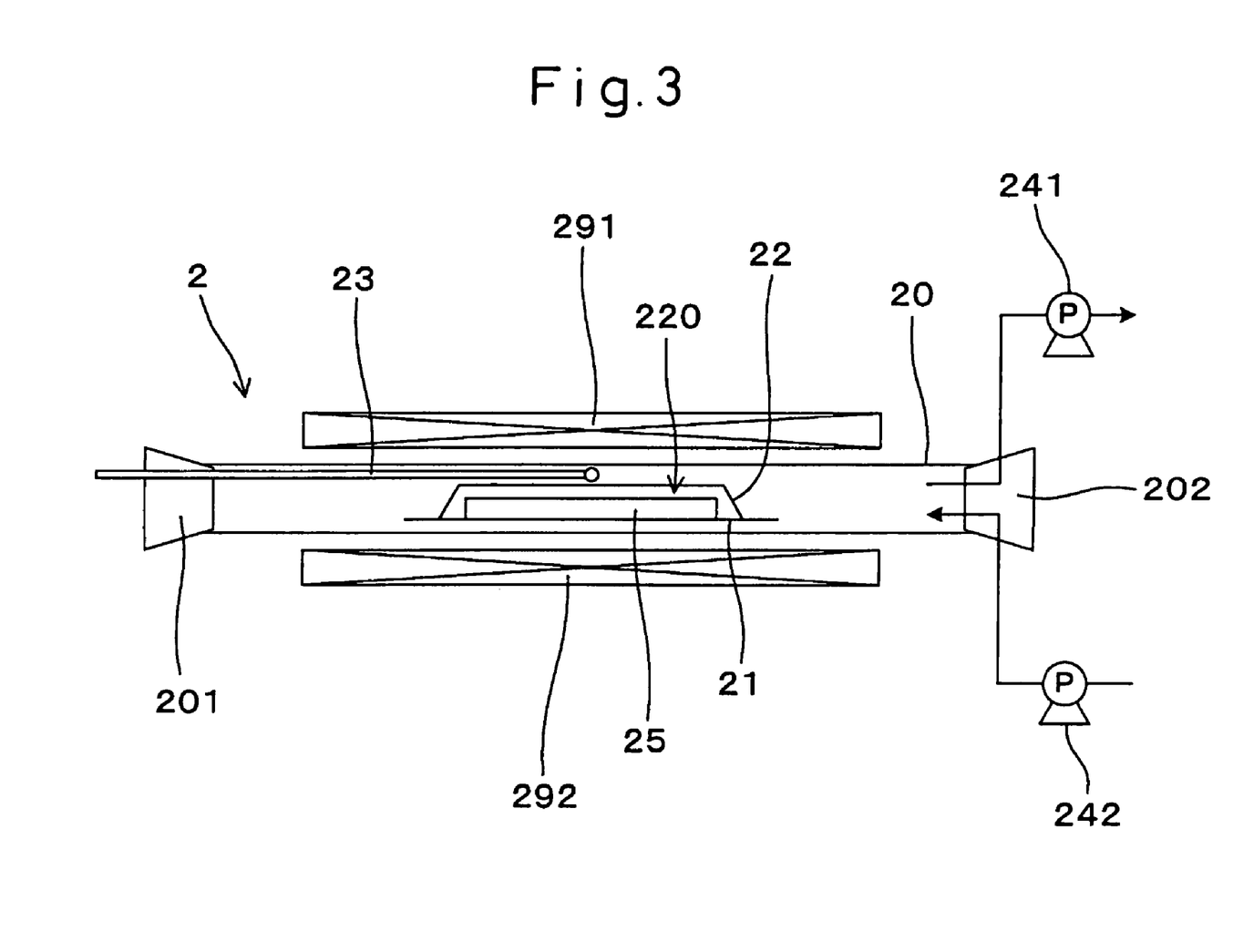
FIG. 3 is an explanatory view when an unfired stacked body is fired by using a tubular furnace according to Example 2.

Specifically, the firing was performed by using a firing apparatus 2 as shown in FIG. 3.

In this firing apparatus 2, a tubular furnace 20 having a bore diameter of 50 mm is closed by stopping both ends with plugs 201 and 202 and heated by heaters 291 and 292 disposed above and below the tubular furnace 20. Inside the tubular furnace 20, a placement plate 21 (made of alumina) on which the unfired stacked body 25 is placed, and an alumina boat 22 for covering the unfired stacked body 25 placed on the plate are disposed. The space 220 formed between the alumina boat 22 and the placement plate 21 is a firing site for the unfired stacked body 25 and the volume of this potion is 12 cm³. Numerical reference 23 is a thermometer and this is used for adjusting the firing temperature.

Two rotary pumps 241 and 242 are connected to the tubular furnace 20 and by using these pumps, the oxygen concentration of the internal atmosphere in the tubular furnace 20 is adjusted to 40 to 100 vol %.

Specifically, the air inside the tubular furnace 20 was evacuated by one rotary pump 241 to reduce the pressure and thereafter, oxygen was introduced by using another rotary pump 242 until the inside of the tubular furnace 20 reached an atmospheric pressure.

In this way, an atmosphere having an oxygen concentration of 40 vol % or more was formed.

Thereafter, the firing was performed through the following temperature-rising process to obtain a fired stack.

That is, the temperature was raised at 200° C./hour for 3 hours and after reaching 600° C., raised at 40° C./hour for 9 hours. After reaching 960° C., the system was further heated to elevate the temperature to a maximum temperature and kept at the maximum temperature for 2 hours. Thereafter, the system was cooled at least at 65° C./hour for 1 hour and further at 150° C./hour for 6 hours to room temperature. An oxygen gas was supplied at 20 ml/min during firing.

Subsequently, a printing paste for the side electrode was coated to obtain side electrodes as shown in FIG. 1 and then fired. The stack was finally washed and dried to obtain a piezoelectric stack 1.

Several piezoelectric stacks were produced by the above-described method and each was subjected to performance tests. The results are described below.

At the time of firing the unfired stacked body through the temperature-rising process described above, the samples were produced by changing the maximum temperature to 1,065° C., 1,100° C., 1,015° C. and 965° C., respectively. Incidentally, in all piezoelectric stacks, the oxygen concentration of the firing atmosphere was 90 vol %.

The grain boundary-filling factor of these piezoelectric stacks was measured by the method described in Example 4 and found to exceed 95% in all samples.

Also, the performance was examined by the method described in Example 3, as a result, all piezoelectric stacks revealed excellent durability with almost no decrease in the insulation resistance value even when the endurance time was over 1,000 hours.

As described in this Example, by performing the firing at an oxygen concentration in the above-described range, the Pb-based glass more readily fills the crystal grain boundary. The crystal grain boundary filled with a Pb-based glass can be made not to allow for intrusion of moisture or other substances.

Therefore, the piezoelectric layer can be prevented from change in the physical properties such as insulation resistance value and the piezoelectric stack can be prevented from deterioration in the performance or reduction in the reliability.

In this way, according to this Example, a production method of a piezoelectric stack substantially free from deterioration in the performance and having high reliability can be provided.

Figure 4:
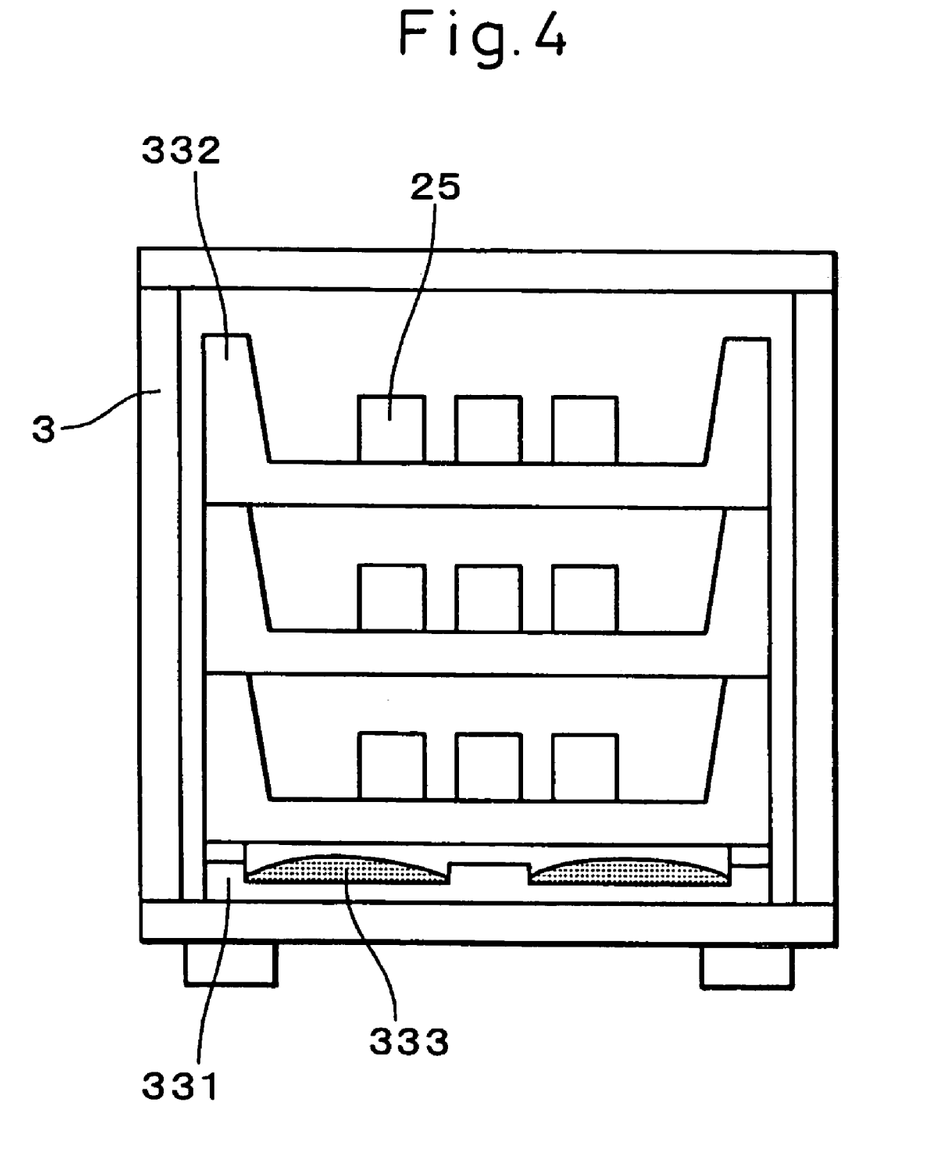
FIG. 4 is an explanatory view when an unfired stacked body is fired by using a firing furnace according to Example 2.

FIG. 4 shows another example of the firing furnace for firing the piezoelectric stack.

In a firing furnace 3 shown in FIG. 4, a setter 331 having disposed therein an atmosphere adjusting agent 333 and a setter 332 having disposed therein the unfired stacked body 25 are put by piling these. For the atmosphere adjusting agent 333, lead zirconate ($PbZrO_3$) is used.

Two rotary pumps are connected in the same manner as in FIG. 3 and, by using these pumps, the oxygen concentration of the internal atmosphere in the firing furnace 3 was adjusted to 40 to 100 vol %.

As for other details, the firing can be performed in the same manner as in the case of using a tubular furnace 2 shown in FIG. 3.

Example 3

In this Example, the crystal grain boundary-filling factor of a Pb-based glass and the performance of the piezoelectric stack are evaluated.

Piezoelectric stacks have the partial electrode structure described in Example 1, and were prepared by varying the grain boundary-filling factor. That is, Sample 1 (grain boundary-filling factor: 95%), Comparative Sample C1 (grain boundary-filling factor: 47%) and Comparative Sample C2 (grain boundary-filling factor: 12%). For each of these sample and comparative samples, two piezoelectric stacks were prepared and subjected to the measurements described later.

Figure 5:
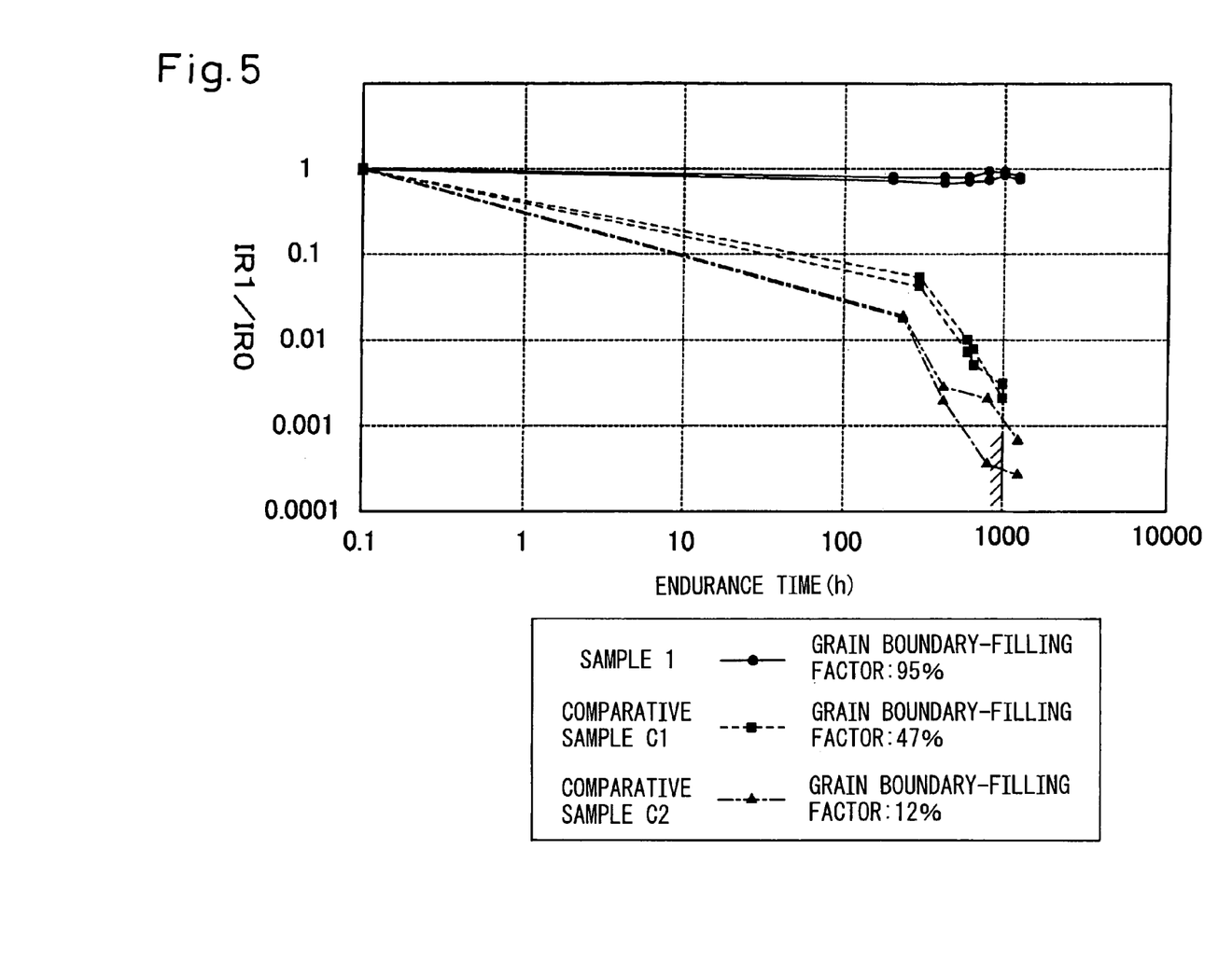
FIG. 5 is a diagram showing IR1/IR0 of a sample and of comparative samples differing in the grain boundary-filling factor according to Example 3.

Each sample was sealed in an airtight package and left standing in an environment at a temperature of 190° C. for 1 to 1,000 hours. FIG. 5 is a diagram where, if the insulation resistance value before standing is IR0 and the insulation resistance value after standing is IR1, the values of IR1/IR0 are plotted on the ordinate and the endurance time is taken on the abscissa.

As seen from FIG. 5, Sample 1 according to the present invention is a piezoelectric stack having excellent durability with almost no decrease in the insulation resistance value even after the passage of 1,000 hours, whereas Comparative Samples 1 and 2 each decreases in insulation resistance value with the passing of time.

The measuring method of the grain boundary-filling factor is described in Example 4 later and the measuring method of the insulation resistance value is described in Example 5 later.

Example 4

The fine structure of the piezoelectric layer and the measuring method of the grain boundary-filling factor are described.

The fine structure of the piezoelectric layer in the piezoelectric stack comprises, as shown in FIG. 6, an amorphous crystal grain 31 and a Pb-based glass 32 filled in the gap formed at the crystal grain boundary 310 between crystal grains 31.

The grain boundary-filling factor was measured from a reflection electron image (compositional image) of crystal grains 31 in the piezoelectric layer, which was obtained by a reflection electron detector integrated in a scanning electron microscope (SEM).

The conditions of the reflection electron detector used in the measurement of Example 3 are as follows.

| | |
|---|---|
| Device used: | scanning electron microscope |
| Manufacturer: | Hitachi, Ltd. |
| Model: | S4300 |
| Presence or absence of vapor deposition on sample | absent |

-continued

| | |
|---|---|
| (fractured face of piezoelectric stack): | |
| Accelerating voltage: | 5 kV |
| Magnification at observation: | from several hundred to 10,000 times |
| WD (working distance): | 15 mm |
| Reflection electron detector: | YAG young scintillator type |

The observation was performed for the fractured face of the piezoelectric stack in the region applied with an electric field, and the grain boundary-filling factor was calculated as follows on one crystal grain 31 of the piezoelectric layer.

As shown in FIG. 7, the grain boundary-filling factor is a value (%) obtained by dividing the grain boundary length J1 in the region filled with a Pb-based glass by the entire grain boundary length J.

The entire grain boundary length J as used herein is, as shown in FIG. 7, in one relevant crystal grain 31, "length J1 of filled grain boundary (that is, the length of the portion where a Pb-based glass is adhering to the interface of crystal grains)+length J0 of unfilled grain boundary".

In actual measurement, the fractured face of the piezoelectric stack was observed at a magnification of 10,000, two crystal grains were picked up and measured per one fractured face, and this measurement was performed for three fractured faces.

The average value of the grain boundary-filling factors thus obtained from six crystal grains in total was used as the "grain boundary-filling factor of the piezoelectric stack".

Example 5

The measurement method of the insulation resistance value is described.

Figure 8:
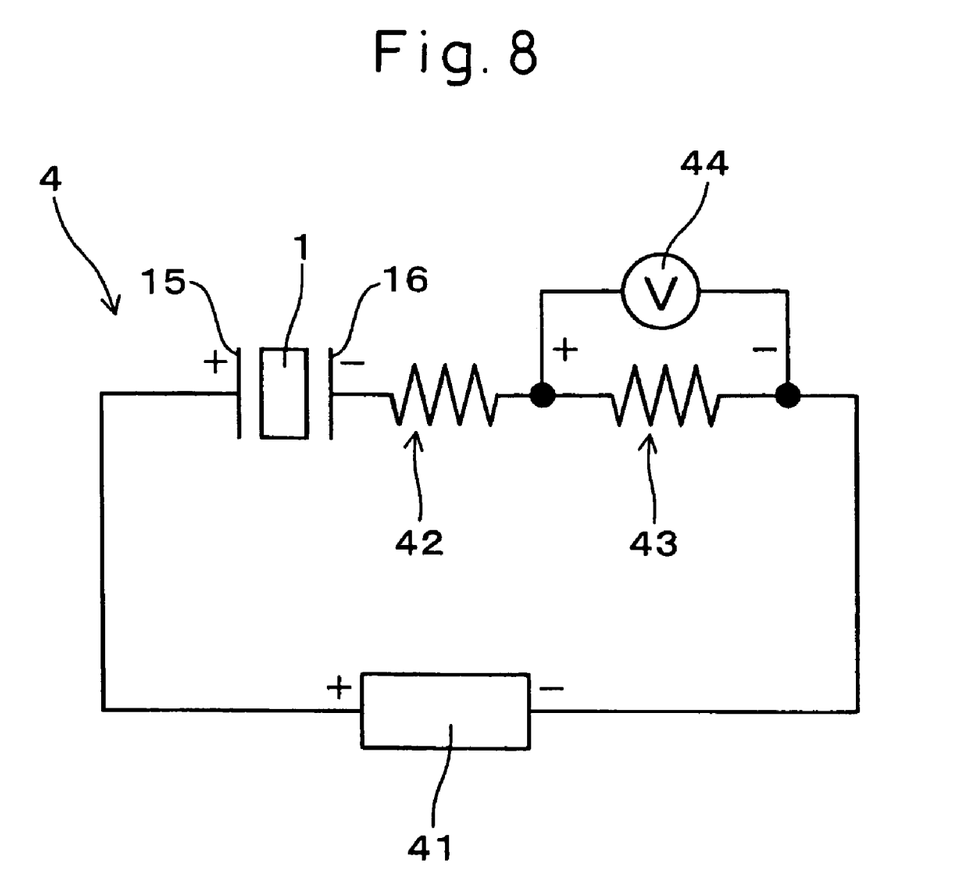
FIG. 8 is an explanatory view of the measurement circuit for measuring the insulation resistance value according to Example 5.

As shown in FIG. 8, the piezoelectric stack 1 was connected in series with a circuit protection resistor 42, a resistor 43 of 10 kΩ and a DC power source 41 and at the same time, connected with a measurement circuit 4 comprising a digital multi-meter 44 connected in parallel with the resistor 43 of 10 kΩ.

In this measurement circuit 4, a DC voltage of 150 V was applied from side electrodes 15 and 16 of the piezoelectric stack 1 and after 2 minutes, the value of the digital multi-meter 44 was read. The circuit current value was determined from the voltage and according to the formula of insulation resistance value=150/circuit current value, the insulation resistance value of the piezoelectric stack 1 could be calculated.

Example 6

In this Example, the relationship between the difference of firing temperature for the piezoelectric stack and the grain boundary-filling factor were measured by using Sample 2 and Comparative Sample C3.

Sample 2 is a piezoelectric stack produced by the production method of Example 2, where the pressure inside the tubular furnace was 1 atm and the oxygen concentration was 90 vol % (with the balance being, for example, nitrogen and some $CO_2$).

Comparative Sample C3 was produced by the same production method as in Example 2 except for performing the firing while leaving the inside of the tubular furnace as-is in an air atmosphere. Accordingly, the oxygen concentration was about 20 vol %. For each of these sample and comparative sample, two piezoelectric stacks were prepared and measured.

Figure 9:
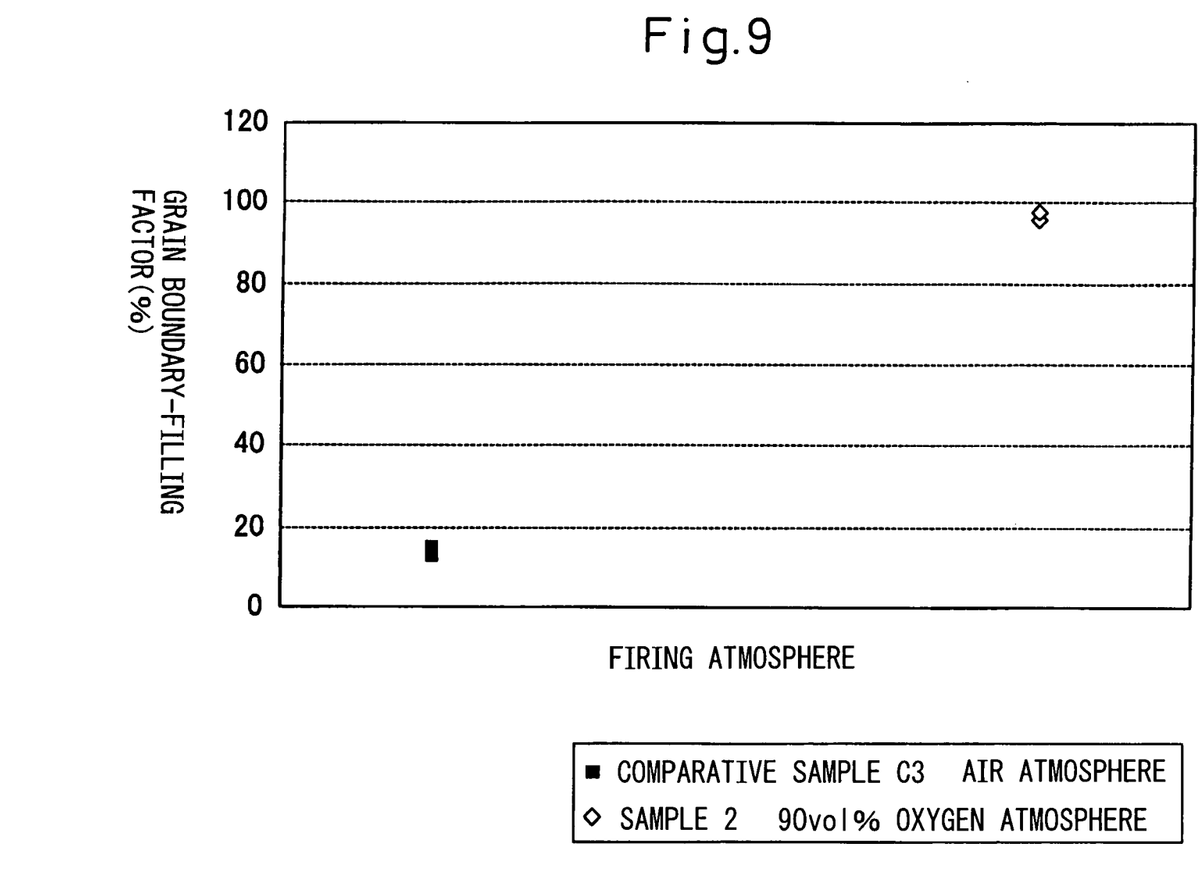
FIG. 9 is a diagram showing the grain boundary-filling factors of the piezoelectric stack fired in air and the piezoelectric stack fired in an oxygen atmosphere according to Example 6.

As seen from FIG. 9, the grain boundary-filling factor in the crystal grin boundary of the piezoelectric stack fired in air is very low, and 20% or less, and by performing the firing in an oxygen atmosphere having an oxygen concentration of 90 vol %, a piezoelectric stack having a high filling factor, of 95% or more, can be obtained.

Example 7

With respect to the piezoelectric stack having a partial electrode structure, the relationship between the length of the void formed at the end part of the internal electrode layer and the decrease in the insulation resistance value was measured.

Figure 10:
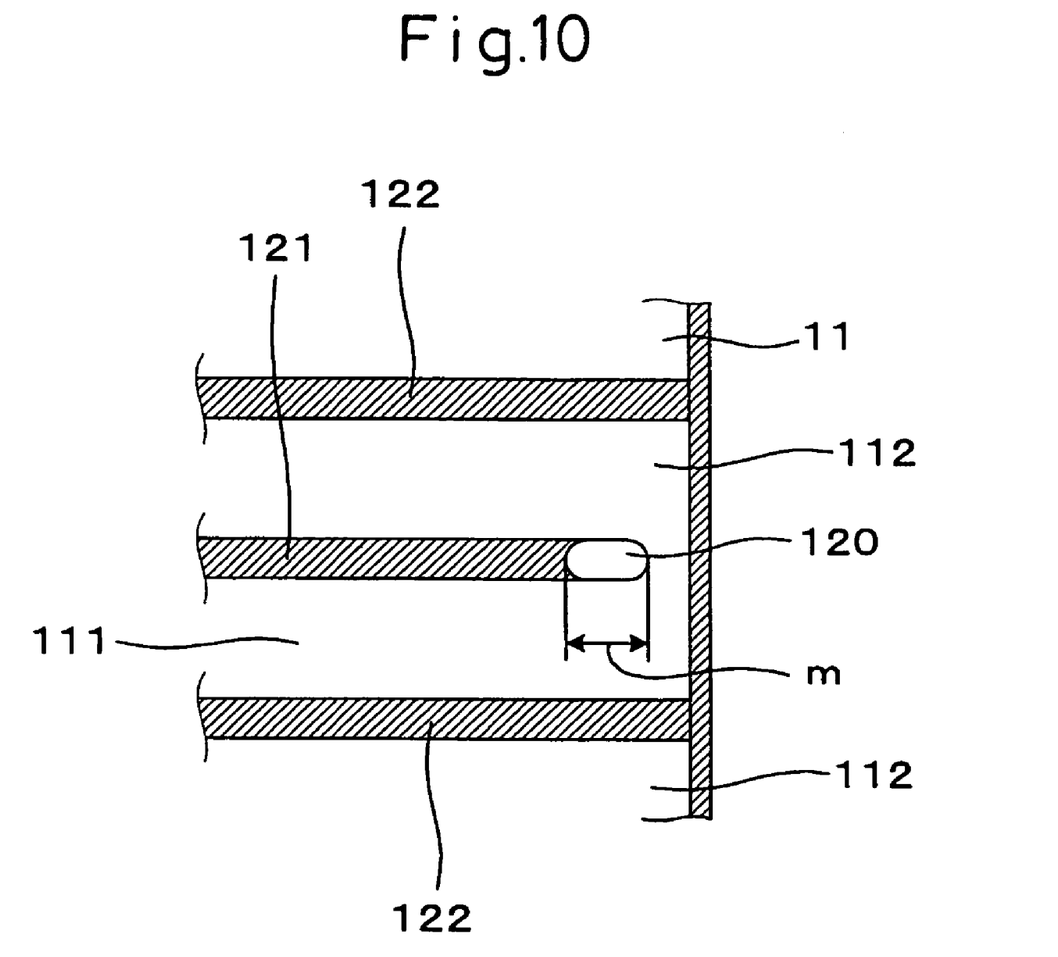
FIG. 10 is an explanatory view regarding the void formed at the end part of the internal electrode layer according to Example 7.

As shown in FIG. 10, a void 120 is sometimes formed at the end part of the internal electrode layer 121.

The "length of the void" is the long dimension m of the void 120 shown in FIG. 10 and the length from starting point to end point of voids continuously formed at the end part of the internal electrode layer 121 or 122.

A large number of piezoelectric stacks were produced and the length of the void formed at the end part of the internal electrode layer was measured. Also, IR1/IR0 in each piezoelectric stack was measured by the method described in Example 3. The results are shown in Table 1 by rating "absence" when IR1/IR0 between before and after endurance is 0.01 or less, and otherwise rating "present".

As seen from Table 1, when the void length is 30 μm or less, the insulation resistance value is not decreased between before and after the endurance test and a piezoelectric stack having excellent durability can be obtained.

TABLE 1

| Void Length (μm) | 0 | 8 | 19 | 29 | 43 | 51 | 73 |
|---|---|---|---|---|---|---|---|
| Decrease in Insulation Resistance Value | absence | absence | absence | absence | present | present | present |

Each comparative Sample C3 and Sample 2 produced in Example 6 was cut to obtain the cross-section of FIG. 10 and after polishing the surface, the presence or absence of the void formed at the end part of the internal electrode layer 121 as shown in FIG. 10 was examined by a common metallurgical microscope.

As a result, Sample 2 had an apparently small void length of 5 μm and Comparative Sample C2 had a large void length of 45 μm.

From these, it is seen that the void formed at the end can be made small by performing the firing in an atmosphere at a high oxygen concentration.

Example 8

In this Example, the fuel injection device having a built-in piezoelectric actuator comprising the piezoelectric stack according to the present invention is described.

Figure 11:
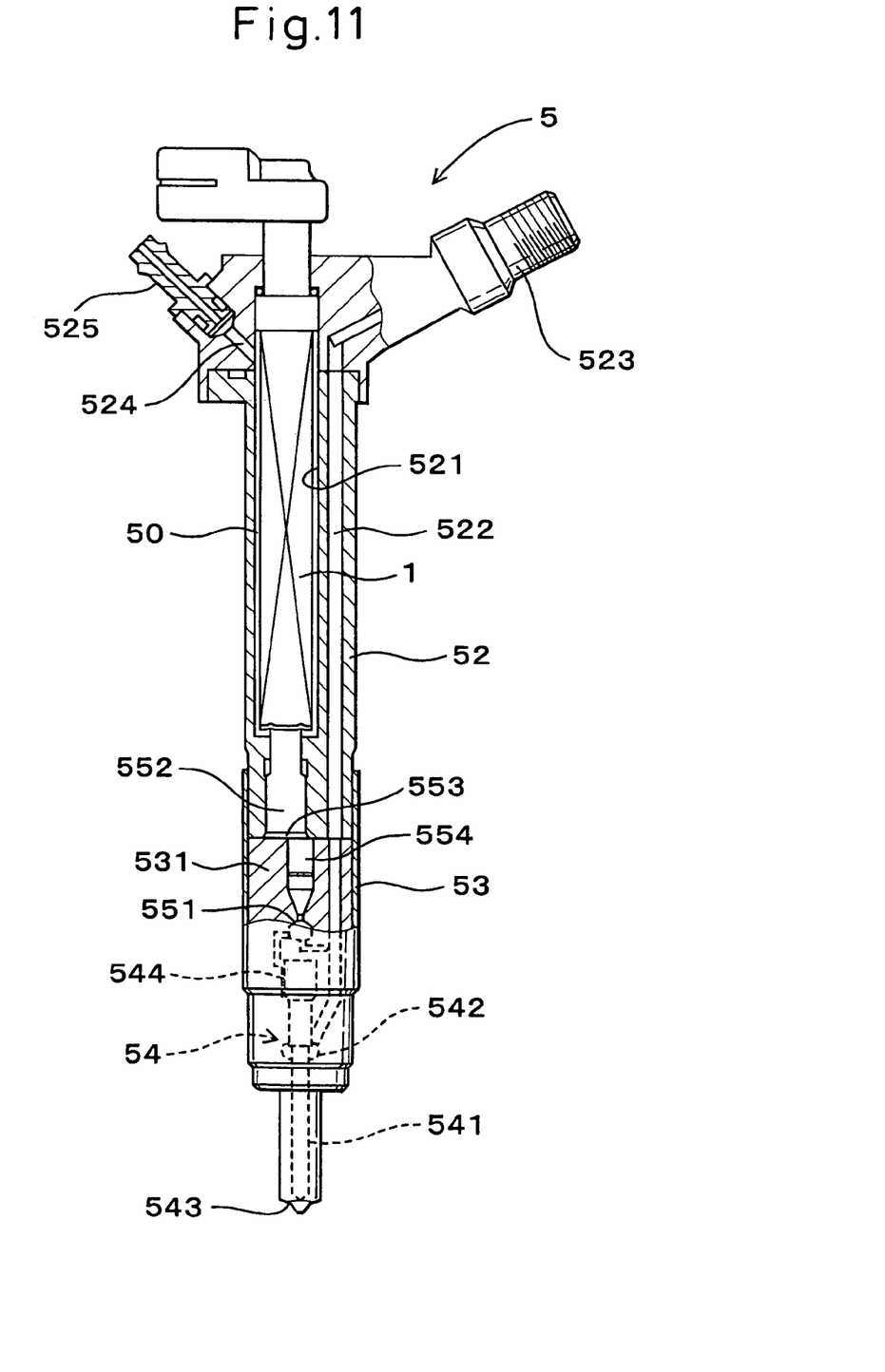
FIG. 11 is a cross-sectional explanatory view of the fuel injection device 5 according to Example 8.

The fuel injection device 5 described in this Example is, as shown in FIG. 11, applied to a common rail injection system of a diesel engine.

This fuel injection device 5 comprises, as shown in FIG. 11, an upper housing 52 for housing a piezoelectric stack 1 as a driving part, and a lower housing 53 being fixed to the lower end of the upper housing and having formed therein an injection nozzle part 54.

The upper housing 52 is substantially cylindrical and a piezoelectric stack 1 is fitted into and fixed in a longitudinal hole 521 which is eccentric to the center axis.

A high-pressure fuel passage 522 is disposed in parallel with and on the side of the longitudinal hole 521, and its upper end part passes through a fuel introduction pipe 523 protruding upward from the upper housing 52 and communicates with an external common rail (not shown).

A fuel lead-out pipe 525 communicating with a drain passage 524 protrudes from the upper part of the upper housing 52, and the fuel flowing out from the fuel lead-out pipe 525 is returned to a fuel tank (not shown).

The drain passage 524 communicates with a three-way valve 551 described later through a passage (not shown) which passes through a gap 50 between the longitudinal hole 521 and the piezoelectric device 1 and extends downward from this gap 50 inside the upper and lower housings 52 and 53.

The injection nozzle part 54 comprises a nozzle needle 541 which slides up and down inside a piston body 531, and an injection hole 543 which is opened or closed by the nozzle needle 541 and injects the high-pressure fuel supplied from a fuel reservoir 542 into each cylinder of an engine. The fuel reservoir 542 is formed around an intermediate part of the nozzle needle 541, and the lower end part of the high-pressure fuel passage 522 opens to this fuel reservoir. The nozzle needle 541 receives fuel pressure in the valve opening direction from the fuel reservoir 542 and receives fuel pressure in the valve closing direction from a backpressure chamber 544 provided to oppose the upper end face. When the pressure of the backpressure chamber 544 drops, the nozzle needle 541 lifts, as a result, the injection hole 543 is opened and the fuel is injected.

The pressure in the backpressure chamber 544 is increased or decreased by the three-way valve 551. The three-way valve 551 is constituted such that the backpressure chamber 544 selectively communicates with the high-pressure fuel passage 522 or the drain passage 524, and has a ball-like valve body which opens or closes a port communicating with the high-pressure fuel passage 522 or the drain passage 524. This valve body is driven by the above-described driving part 1 through a large diameter piston 552, an oil pressure chamber 553 and a small diameter piston 554 which are disposed below the driving part.

The fuel injection device 5 having such a structure is disposed in an automobile or the like with a diesel engine and in a severe environment exposed to high-temperature fuel or damp.

Therefore, the piezoelectric stack 1 in this fuel injection device 5 is hermetically sealed in an airtight package and in this state, disposed in the longitudinal hole 521.

The displacement precision of the piezoelectric stack 1 in the fuel injection device 5 greatly affects the diesel engine performance and therefore, the correct displacement must last as long as possible.

In this respect, the piezoelectric stack 1 of Example 1 of the present invention is substantially free from change in the physical properties such as insulation resistance value of the piezoelectric layer and suffers less from deterioration in the performance or reduction in the reliability. Accordingly, the piezoelectric stack 1 of the present invention is most suitable for use in a fuel injection device and can exert excellent properties to greatly contribute to enhancement of the performance of a fuel injection device 5.

What is claimed is:

1. A piezoelectric stack obtained by alternately stacking a piezoelectric layer comprising PZT (lead titanate zirconate) and an internal electrode layer, wherein the grain boundary-filling factor of a Pb-based glass in the crystal grain boundary of said piezoelectric layer is 95% or more over the whole crystal grain boundary of the piezoelectric layer.

2. The piezoelectric stack according to claim 1, wherein said grain boundary-filling factor of a Pb-based glass is 100%, and wherein the grain boundary-filling factor is a value obtained by dividing grain boundary length in the region filled with Pb-based glass by the entire grain boundary length.

3. The piezoelectric stack according to claim 1, wherein said piezoelectric stack has a partial electrode structure and the length of a void formed during a firing step in manufacture of the stack at the end part of the internal electrode layer is less than 30 μm.

4. The piezoelectric stack according to claim 1, wherein said piezoelectric stack is a piezoelectric actuator disposed as a driving source in a fuel injection device of an internal combustion engine.

* * * * *